United States Patent [19]

Foulke

[11] Patent Number: 4,699,556
[45] Date of Patent: Oct. 13, 1987

[54] OBJECT HANDLING APPARATUS

[75] Inventor: Richard F. Foulke, Carlisle, Mass.

[73] Assignee: Proconics International, Inc., Woburn, Mass.

[21] Appl. No.: 611,419

[22] Filed: May 17, 1984

[51] Int. Cl.$^4$ .............................................. B65G 65/00
[52] U.S. Cl. ........................ 414/404; 74/89.2; 74/108; 198/379; 414/416; 414/783
[58] Field of Search ............... 414/754, 404, 416, 752, 414/222, 225, 783; 104/37, 39; 74/89.2, 89.22, 108; 198/379, 395, 399

[56] References Cited

U.S. PATENT DOCUMENTS

| | | | |
|---|---|---|---|
| 2,786,361 | 3/1957 | Russell | 74/89.22 |
| 3,220,577 | 11/1965 | Laverne | 414/525 |
| 3,273,408 | 9/1966 | Nagel et al. | 74/89.22 |
| 3,340,176 | 9/1967 | Belluso et al. | 414/217 X |
| 3,385,120 | 5/1968 | Nott | 74/104 |
| 3,503,527 | 3/1970 | Devol | 414/783 X |
| 3,987,685 | 10/1976 | Opocensky | 74/471 XY |
| 4,226,569 | 10/1980 | Gerard et al. | 414/783 X |
| 4,466,766 | 8/1984 | Geren et al. | 414/404 |
| 4,493,606 | 1/1985 | Foulke et al. | 414/404 X |
| 4,501,527 | 2/1985 | Jacoby et al. | 414/225 |

OTHER PUBLICATIONS

"Automatic Wafer Transfer and Turnover Tool", Abraham et al., Western Electric Tech. Dig., No. 49, Jan. 1978.

Primary Examiner—Robert J. Spar
Assistant Examiner—Stuart J. Millman

[57] ABSTRACT

Apparatus for transporting flat objects having first and second faces between a first carrier and a second carrier, the apparatus comprising a mechanism for supporting the first and second carriers, a pickup mechanism for picking up the objects and transporting the objects between the first carrier and the second carrier, and intermediate station having a mechanism for receiving the objects from the pickup mechanism with the faces in a first orientation and for changing the orientation of the faces before the objects are removed by the pickup mechanism.

5 Claims, 6 Drawing Figures

OBJECT HANDLING APPARATUS

BACKGROUND OF THE INVENTION

This invention relates to apparatus for automatic placement of flat objects, e.g., placing semiconductor wafers in carriers or boats.

It is desirable to rapidly and automatically transfer semiconductor wafers from plastic storage boats to quartz processing boats (in which they are introduced into a diffusion furnace), and vice versa, without introducing contamination onto the surfaces of the wafers. Such contamination often results during wafer placement in the quartz boats, from the wafers scraping against the slots into which they are placed. Contamination can also arise from scraping and sliding of parts within the apparatus being used to accomplish the transfer.

U.S. Pat. No. 4,493,606 which is hereby incorporated by reference, disclose prior wafer transfer handling apparatus having two trolleys (one for a quartz boat and one for plastic boats) movable along parallel directions, and a vacuum pickup arm that moves in a transverse direction and engages different wafers in different slots in the boats as the trolleys move the slots into position. In using the apparatus described in this patent, the fronts and backs of the wafers are typically in the same orientation in the plastic and quartz boats. If it is desired to change the orientation of the faces of semiconductor wafers between their removal from plastic storage boats and their deposit in quartz boats, for example to place wafers back-to-back to affect wafer treatment, the wafers have to be transferred either by hand or by rotating a carrier, e.g., in a mass transfer system, something that can result in contamination of and damage to the wafers.

SUMMARY OF THE INVENTION

In general, the invention features changing the orientation of flat objects (e.g., semiconductor wafers) during transport by pickup means between two carriers (e.g., plastic and quartz storage boats) by providing an intermediate station that receives a flat object from the pickup means in one orientation and changes the orientation of the object before it is removed by the pickup means.

In preferred embodiments, the intermediate station has a cradle for receiving and rotating the object; a vacuum actuator is used to drive the cradle; the actuator is connected to a drive shaft for the cradle via a cable that engages a pulley on the drive shaft; the vacuum actuator rotates the cradle in one direction, and there is a second vacuum actuator that rotates the cradle in the other direction; there are valves for alternately connecting the vacuum actuators to a vacuum source, so that the actuator that is not connected controls the speed with which the vacuum actuator that is connected rotates the cradle; there is a stop mechanism for preventing rotation of the cradle beyond a predetermined position at which the object is in a position to be removed by the pickup means; the stop mechanism comprises a disk mounted for rotation with the cradle, a stop bar mounted on the disk, and a corresponding stop member encountered by the stop bar once the cradle has rotated to the wafer pickup position; the disk has an opening through it, and there is an energy-beam source and sensor to detect the opening; the pickup means has a flat pickup paddle adapted to engage wafers on opposite paddle surfaces, and the cradle has two sets of slots for receiving two wafers at one time; the carriers are supported by trolleys which are slidably mounted for movement along parallel directions, and the pickup means comprises an arm movable in a transverse direction; and the intermediate station is mounted for movement on a trolley.

Other features and advantages of the invention will be apparent from the following description of the preferred embodiment, and from the claims.

DESCRIPTION OF THE PREFERRED EMBODIMENT

We first briefly describe the drawings.

DRAWINGS

STRUCTURE

Figure 1:
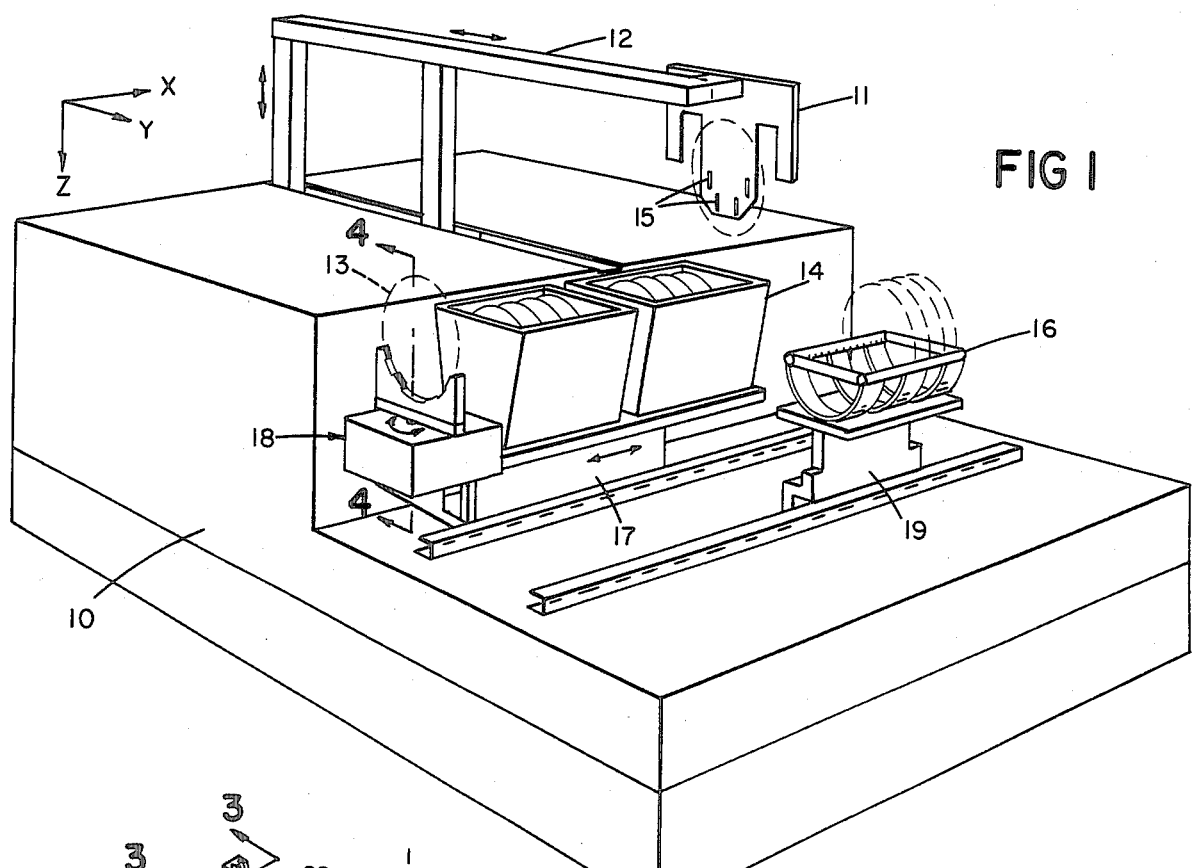
FIG. 1 is a diagrammatic perspective view of wafer handling apparatus according to the invention.

Referring to FIG. 1, there is shown wafer handling apparatus 10, having arm 12 for moving wafers 13 from slots in plastic storage boats 14 into slots in quartz processing boat 16. Pickup paddle 11 is located at the end of arm 12 and has openings 15 connected to a vacuum source on its front and back faces to permit it to pick up and retain one or two wafers at one time. Arm 12 is horizontally and vertically movable in the Y-Z directions. Plastic boats 14 and quartz boat 16 are movable in the X direction by trolleys 17, 19, described in detail in the above-mentioned '191 patent application. Intermediate station 18, which provides for reversing the orientation of the front and back faces of a wafer 13 between its removal from one of plastic boats 14 and its deposit in quartz boat 16 if desired, is attached to trolley 17 for movement in the X direction with plastic boats 14.

Figure 2:
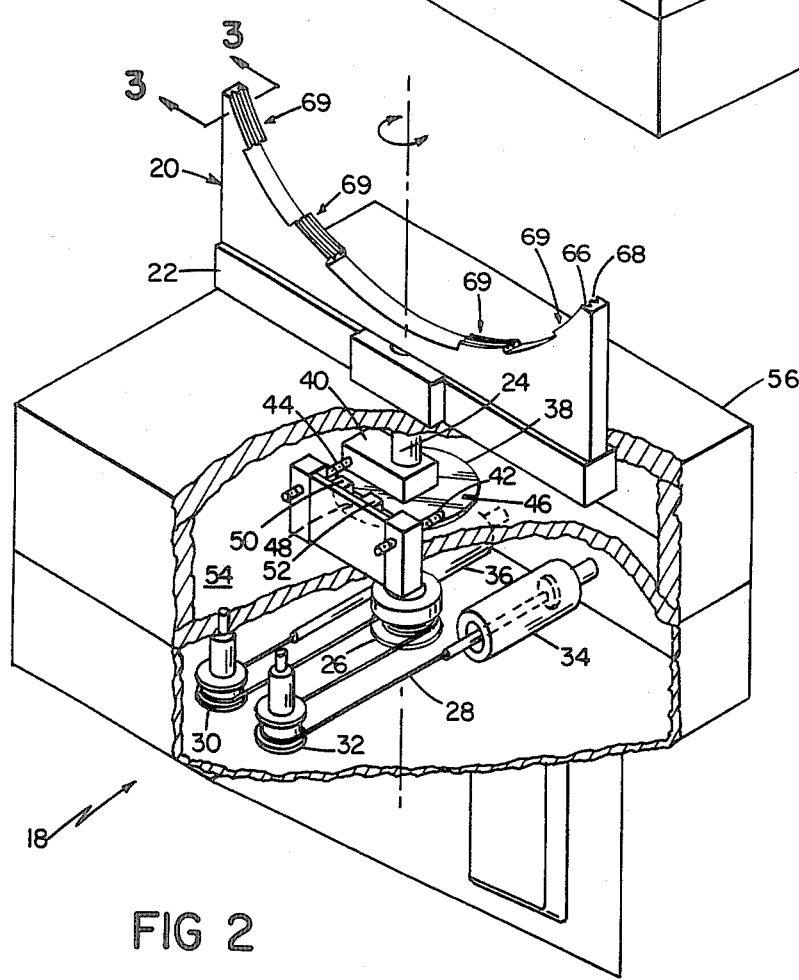
FIG. 2 is a perspective view, diagrammatic and partially broken away, of an intermediate station of the apparatus of FIG. 1.
Figure 3:
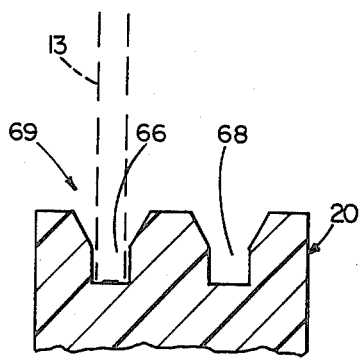
FIG. 3 is a sectional view, taken at 3—3 of FIG. 2, of a portion of a component of the FIG. 2 station.
Figure 4:
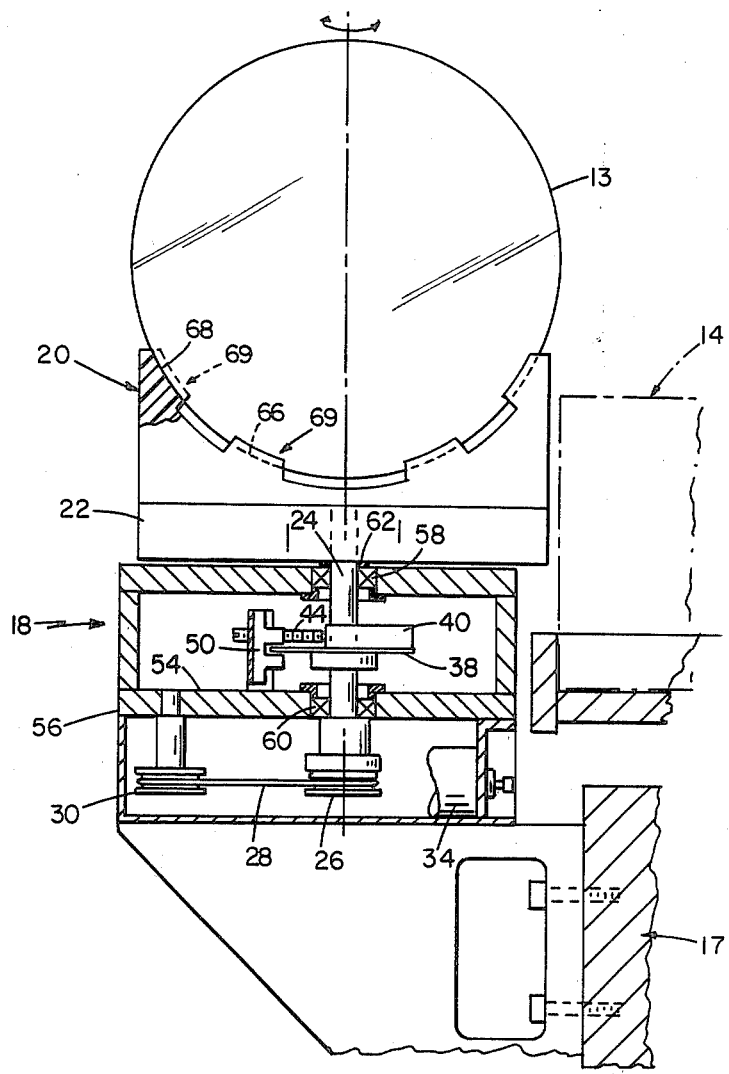
FIG. 4 is a vertical sectional view, taken at 4—4 of FIG. 1, of the FIG. 2 station with its cradle in a position rotated from that shown in FIG. 2.

Referring to FIGS. 2–4, intermediate station 18 is shown to include cradle 20 for receiving wafers 13. Cradle 20 is mounted on horizontal support bar 22, which in turn is affixed to the top of vertical drive shaft 24. Drive shaft 24 in turn has drive pulley 26 (0.768" diameter) affixed at its lower end. Drive cable 28 engages drive pulley 26 as well as idler pulleys 30 and 32 (0.8" diameters), and is connected at its ends to vacuum actuators 34 and 36 (Airpot S160P150Y).

Disk 38 is mounted above pulley 26 on drive shaft 24, and bears stop bar 40 on its upper surface. Stop bar 40 comes up against either adjustable stop screw 42 or adjustable stop screw 44 as disk 38 rotates, thus stopping the rotation of disk 38 and, in turn, drive shaft 24 and cradle 20. Disk 38 also has slots 46 and 48, which allow for a determination of the position of disk 38 when one of them becomes positioned between its respective infrared source/sensor device 50 or 52, the sources and sensors of which are located above and below disk 38. Adjustable stop screws 42 and 44 and infrared source/sensor devices 50 and 52 are mounted on intermediate support plate 54.

The entire drive mechanism for the cradle is encased in housing 56 to protect wafers from contamination caused therein. Bearings 58 and 60 for drive shaft 24 are mounted in the top plate of housing 56 and in support plate 54, respectively. Seal 62 is located on drive shaft 24 between the upper plate of housing 56 and support bar 22.

FIG. 3 shows two sets of slots 66, 68, 0.065 inches deep, in cradle 20 at four portions 69 (FIG. 4) for receiving two wafers therein. The positions of portions 69 are selected to insure that only certain sections of the perimeter of a wafer contact the cradle and to accommodate small variations in diameters of wafers having the same nominal diameter.

Figure 5:
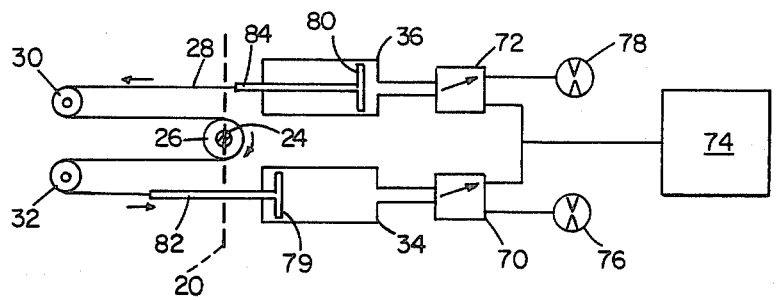
FIGS. 5 and 6 are diagrams of the vacuum activated drive system of the FIG. 2 station.
Figure 6:
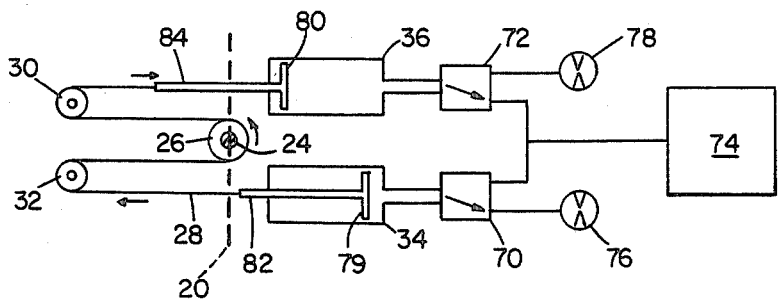

FIGS. 5 and 6 illustrate the drive mechanism for intermediate station 18. Vacuum actuators 34 and 36 are connected to solenoid control valves 70 and 72, respectively. Solenoid valve 70 selectively connects the chamber of actuator 34 to either vacuum source 74 or flow restrictor 76. Solenoid valve 72 similarly selectively connects the chamber of actuator 36 to either vacuum source 74 or flow restrictor 78. Piston 79 of vacuum actuator 34 and piston 80 of vacuum actuator 36 are connected to the ends of drive cable 28 by links 82, 84.

OPERATION

The overall operation of wafer handling apparatus 10 is described in detail in the above-mentioned patent. The standard transfer process involves picking up wafers from plastic boats 14 by arm 12 on paddle 11 and placing the wafers directly in quartz boat 16, the front and back faces of the wafers placed in quartz boat 16 retaining the same orientation they had in plastic boats 14.

If one desires to reverse the orientation of the faces of selected wafers before placing them in quartz boat 16, this is accomplished by removing a wafer from a plastic boat 14 and depositing it in cradle 20 using arm 12, rotating cradle 20 180° to reverse the orientation of the faces of the wafer, retrieving the wafer from cradle 20 and placing it in quartz boat 16. Because the wafers are rotated mechanically by intermediate station 18, rather than manually, they are rotated simply and efficiently, and protected from damage and contamination.

To rotate cradle 20 clockwise 180° from the initial position shown in FIG. 2, solenoid valves 70, 72 are placed in the control positions shown in FIG. 5 upon receiving control signals from a microprocessor controller (not shown), solenoid valve 70 being connected to vacuum source 74, and solenoid valve 72 being connected to flow restrictor 78. This causes piston 79 in vacuum actuator 34 to move away from idler pulley 32, drawing drive cable 28 with it. The speed with which the cable is drawn is determined by how much resistance is exerted on piston 80 by flow restrictor 78.

Movement of drive cable 28 toward actuator 34 causes drive pulley 26 (upon which drive cable 28 is wound several times to prevent slippage) to rotate clockwise in turn causing drive shaft 24 and cradle 20 to correspondingly rotate. The extent of the rotation of cradle 20 is limited to 180° by means of disk 38 attached to drive shaft 24, the rotation of said disk being limited to 180° by virtue of stop bar 40 mounted thereon coming up against stop screw 42. In this position slot 46 is aligned with infrared source/sensor 52, providing a signal to the controller that cradle 20 is in this position.

Flow restrictor 78 provides a slow five-second rotation of drive shaft 24 and cradle 20. This slow rotation minimizes jarring of the wafer contained in cradle 20, and so helps to minimize the possibility of wafer damage.

To rotate cradle 20 counterclockwise back to the position shown in FIG. 2, solenoid valves 70, 72 are placed in the control positions shown in FIG. 6, solenoid valve 72 being connected to vacuum source 74, and solenoid valve 70 being connected to flow restrictor 76, causing cable 28 to move in the opposite direction. Cradle 20 moves 180° in the corresponding direction until stop bar 40 comes up against stop screw 44, thus returning to its original position, at which slot 48 is aligned with infrared source/sensor 50.

Intermediate station 18 can be used to reverse the orientation of the faces of one or more wafers between pickup from plastic boats 14 and deposit in quartz boat 16. For example, alternate wafers can be reversed so that they are placed back-to-back in close proximity (i.e., the width of paddle 11) in the following manner. Arm 12 picks up a wafer 13 on paddle 11 from a plastic boat 14 and places it in cradle 20 for reversal. While that wafer is being reversed, arm 12 picks up another wafer from a plastic boat 14 on paddle 13. Still holding the second unreversed wafer on one side, paddle 13 picks up the reversed wafer from cradle 20 on its other side, the unreversed wafer being accommodated by the second set of slots in cradle 20 (FIG. 3) during pickup of the reversed wafer from cradle 20. These two wafers are then deposited in quartz boat 16.

One advantage of using the vacuum actuator/flow restriction mechanism is that using a vacuum, as opposed to positive pressure, helps to prevent contamination by sucking away potential contaminants. A further advantage is its very simplicity; very few electrical connections and controls are required for its operation.

OTHER EMBODIMENTS

Other embodiments than the one described hereinabove are possible and fall within the scope of the following claims.

For example, instead of providing flow restrictors 76, 78, their connections to solenoid valves 70, 72 could be closed, and one could rely on the small leakage in vacuum actuators 34, 36 to provide the flow restrictions. Also, in place of cable 28 and pulleys 26, 30, 32, one could use a chain and sprocket mechanism or other mechanical linkage mechanism. Also, cradle 20 could be made of a vertical plate having four (or a different number) of Teflon horizontal members with slots for receiving wafers; an advantage to this structure is that the shapes of the slots and positions of horizontal members can be changed.

I claim:

1. Apparatus for transporting wafers having first and second parallel faces between a first carrier and a second carrier, said apparatus comprising
   means for supporting said first and second carriers,
   pickup means for picking up said wafers and transporting said wafers between said first carrier and said second carrier, and
   intermediate station means comprising engagement means for receiving one of said objects from said pickup means with said faces in a first orientation, and means for rotating said engagement means about an axis parallel to said faces when engaged by said engagement means to change the orientation of said faces with respect to said pickup means before said objects are removed by said pickup means, said engagement means including, a cradle having a set of slots for receiving one of said wafers.

2. The apparatus of claim 1 wherein said pickup means has a flat pickup paddle adapted to engage said wafers on opposite paddle surfaces, and said cradle has two sets of slots for receiving two wafers at one time.

3. Apparatus for transporting flat objects having first and second parallel faces between a first carrier and a second carrier, said apparatus comprising means for supporting said first and second carriers, said means for supporting said first and second carriers comprising first and second trolleys slidably mounted for movement along parallel directions, pickup means for picking up said objects and transporting said objects between said first carrier and said second carrier, said pickup means comprising an arm movable in a transverse direction, and intermediate station means mounted for movement with a said trolley, said intermediate station means comprising means for receiving said objects from said pickup means with said faces in a first orientation and means for changing the orientation of said faces with respect to said pickup means before said objects are removed by said pickup means.

4. The apparatus of claim 3 further comprising means for moving said first carrier into position under said pickup arm for pickup of a first object therefrom, means for thereafter moving said intermediate station means under said pickup arm for receiving said first object, and means for moving said second carrier into position under said pickup arm after said pickup arm has removed said first object from said intermediate station means in a changed orientation.

5. The apparatus of claim 4 wherein said flat objects are semiconductor wafers, said intermediate station means comprises a cradle means having two sets of slots for receiving two wafers at one time and means for rotating said cradle means, and said pickup means has a pickup paddle adapted to engage two wafers on opposite paddle surfaces, and further comprising means for moving said first carrier into position under said pickup arm for pickup of a second wafer on one face prior to picking up the wafer deposited at the cradle means on the other face and carrying both said wafers to said second carrier.

* * * * *